United States Patent
Hung et al.

(10) Patent No.: US 6,770,925 B2
(45) Date of Patent: Aug. 3, 2004

(54) FLUSH MEMORY HAVING SOURCE AND DRAIN EDGES IN CONTACT WITH THE STACKED GATE STRUCTURE

(75) Inventors: Chih-Wei Hung, Hsin-chu (TW); Da Sung, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 128 days.

(21) Appl. No.: 10/065,553

(22) Filed: Oct. 30, 2002

(65) Prior Publication Data

US 2004/0084718 A1 May 6, 2004

(51) Int. Cl.[7] .............................................. H01L 27/108
(52) U.S. Cl. ........................ 257/296; 257/298; 257/303
(58) Field of Search ........................................... 257/296

Primary Examiner—Fetsum Abraham
(74) Attorney, Agent, or Firm—Jiang Chyun IP Office

(57) ABSTRACT

A structure of a flash memory, having a deep P-well formed in an N-type substrate, an N-well formed in the deep P-well, a stacked gate structure formed on the substrate, an N-type source region and an N-type drain region formed in an N-well at two respective sides of the stacked gate, where the N-type source region is in electric contact with the N-well, a P-well formed in the N-well to encompass the N-type source region and to extend towards the N-type drain region through the portion under the stacked gate, and a contact window formed at the junction of the N-type source region and the P-well to electrically short circuit the N-type source region and the P-well. The flash memory uses F-N tunneling effect for programming and the channel F-N tunneling effect to perform the erase operation.

17 Claims, 9 Drawing Sheets

FLUSH MEMORY HAVING SOURCE AND DRAIN EDGES IN CONTACT WITH THE STACKED GATE STRUCTURE

BACKGROUND OF INVENTION

1. Field of the Invention

The invention relates in general to a non-volatile memory (NVM) device, and more particular, to a structure, a fabrication method and an operation method of a flash memory device.

2. Related Art of the Invention

Having the functions of performing multiple times of saving, reading and erasing operations and retention of saved data even when the power Is interrupted, flash memory has become a non-volatile memory device broadly applied in personal computer and electronic equipment.

The typical flash memory uses doped polysilicon to form the floating gate and the control gate. While performing a program or erase operation, the source region, the drain region and the control gate are biased with suitable voltages, such that electrons are injected into or pulled from the polysilicon floating gate.

Generally speaking, the electron injection of the flash memory includes a channel hot-electron injection (CHEI) mode and Fowler-Nordheim (F-N) tunneling mode. The program and erase operation modes of the device are varied according to the methods of electron injection and pull-away.

The NOR array is the most commonly seen flash memory array. In the NOR array, every two memory cells share the contact window of a bit line and a common source line. Therefore, each memory cell occupies the dimension of half of a contact window and half line width of a source line. As each memory cell Is directly connected to the bit line, the memory cell of the NOR array can arbitrarily perform reading and writing operations. The relatively low serial resistance allows a larger current during reading operation of the memory cell; and therefore, the reading speed is faster. However, in the NOR array, a contact window has to be formed in the drain region every two memory cells, so that a larger space is occupied by each memory cell. It is thus difficult to enhance the device integration.

SUMMARY OF INVENTION

The present invention provides a structure, a fabrication method and an operation method of a flash memory device with enhanced device integration.

The structure of the flash memory device provided by the present invention includes the following. A second conductive type first well is formed in a first conductive type substrate. A first conductive type second well is formed in the second conductive type first well. A stacked gate structure is formed on the first conductive type substrate. A first conductive type source region and a first conductive type drain region are formed in the first conductive type second well at two respective sides of the stacked gate structure. The first conductive type drain region and the first conductive type second well are electrically connected to each other. A second conductive type third well is formed in the first conductive type second well, and the second conductive type third well encompasses the first conductive type source region and extends through underneath the stacked gate structure towards the first conductive type drain region. A contact window is formed across the junction between the first conductive type source region and the second conductive type third well to short circuit these two regions.

In the present invention, an N-well is formed in a deep P-well. The N-well and the N-type drain region are electrically connected as a buried bit line. Therefore, an additional contact window is not required to connect between the bit line and the N-type drain region. The integration is thus enhanced. According to the above structure, the flash memory can use FN tunneling effect to inject electrons from the drain region to the floating gate for programming, and the channel FN tunneling effect for performing an erase operation. In addition, as the P-well is short circuited with the source region, the potential of the P-well is the same as that of the source region, such that the isolated P-well has a potential.

The present invention provides a method for fabricating a flash memory device. A substrate on which a second conductive type first well, a first conductive type second well and a stacked gate structure have been sequentially formed is provided. A first patterned photoresist layer is formed on the substrate. The photoresist layer exposes a portion of the substrate predetermined for forming a source region. An ion implantation step is performed to form a second conductive type third well in the first conductive type second well at the part predetermined for forming the source region. The second conductive type third well extends from the part predetermined for forming the source region underneath the stacked gate to an area predetermined for forming a drain region. The first photoresist layer is removed, and a second patterned photoresist layer exposing the area predetermined for forming the drain region is formed. An ion implantation step is performed to form the drain region in the first conductive type second well at the area predetermined for forming the drain region. The drain region is electrically connected to the first conductive type second well. The second photoresist layer is removed, and a third patterned photoresist layer, is formed exposing the substrate predetermined for forming the source region. An ion implantation step is performed for forming the source region in the second conductive type third well in the area predetermined for forming the source region. A spacer is formed at a sidewall of the stacked gate structure. A fourth patterned photoresist layer is formed exposing the source region. The fourth patterned photoresist layer and the spacer are used as a mask for etching the substrate at the source region until reaching the junction between the source region and the second conductive type third well. After removing the fourth photoresist layer, a contact window is formed on the source region. The contact window short circuits the source region and the second conductive type third well.

In the present invention, the photoresist layer is formed covering the area predetermined for forming the drain region first. The area predetermined for forming the source region is implanted with P-type dopant. A thermal process is then performed to drive in the P-type dopant to form a P-well. The P-well extends from the source region through the portion of the substrate underneath the stacked gate to reach the drain region. Another patterned photoresist layer is formed to cover the predetermined source region. Arsenic and phosphoric ions are implanted to form an N-type drain region. Arsenic ions are then implanted to form the N-type source region. The N-type drain region doped with phosphoric ions can withstand high voltage, while the arsenic ions reduce the resistance of the N-type drain region. As the N-type drain region and the N-well are electrically connected and the N-well is used as the buried bit line, an additional contact window electrically connecting the bit line the N-type drain region is not required. Therefore, the device integration is enhanced.

The present invention further provides an operation method of a flash memory device. The flash memory device includes an N-type substrate, a first P-well in the N-type substrate, an N-well in the first P-well, a stacked gate structure including a control gate on the substrate, a source region and a drain region in the N-well at two respective sides of the stacked gate structure, and a second P-well in the N-well. The source region and the drain region are N-type conductive. The drain region is electrically connected to the N-well. The second P-well encompasses the source region and extends under the stacked gate structure to the drain region. The operation method includes the following steps. While programming the flash memory, a first negative voltage is applied to the control gate, such that the source region is floated. A first positive voltage is applied to the drain region for programming the flash memory according to FN tunneling effect. While performing an erase operation on the flash memory, a second positive voltage is applied to the control gate, such that the drain region is floated. A second negative voltage is applied to the source region to use channel FN tunneling effect to perform an erase operation on the flash memory device.

Since the program operation is performed according to the FN tunneling effect, the electron injection efficiency is high, so that the memory current for programming the memory cells is decreased, and the operation speed is increased. As the program and erase are both performed according to F-N tunneling effect, the current consumption is reduced, and the power consumption for the whole memory device is consequently reduced.

The present invention further provides a flash memory array comprising a plurality of memory cells, a plurality of word lines, a plurality of buried bit lines and a plurality of source lines. Every two of the memory cells forms a set. The memory cell sets are arranged into a column/row array. The memory cells in each set share a common source region and a contact window. The neighboring sets share a common drain region. The drain region of each memory cell of each set in each row is coupled to a corresponding buried bit line, and the source region of each memory cell of each set in each row is coupled to a corresponding source line via the common contact window. The gate of each memory cell in each column is coupled to a corresponding word line.

In the present invention, the memory cell array uses a buried bit line to couple with the drain region of the memory cells in each row without an additional contact window for electrically connecting the bit line and the N-type drain region. Therefore, the device integration is enhanced. Further, as the buried bit line is an N-well located alongside of the drain region, the current is not affected even if the resistance of the N-well is high, so that the operation speed will not be affected either. In the memory cell array of the present invention, a buried bit line can connect 32 to 64 memory cells in series, and a contact window is used to connect the buried bit line and a metal line. Therefore, compared to the conventional NAND memory array, the memory cell array provided by the present invention has a relatively high integration.

BRIEF DESCRIPTION OF DRAWINGS

These, as well as other features of the present invention, will become more apparent upon reference to the drawings wherein.

DETAILED DESCRIPTION

Figure 1:
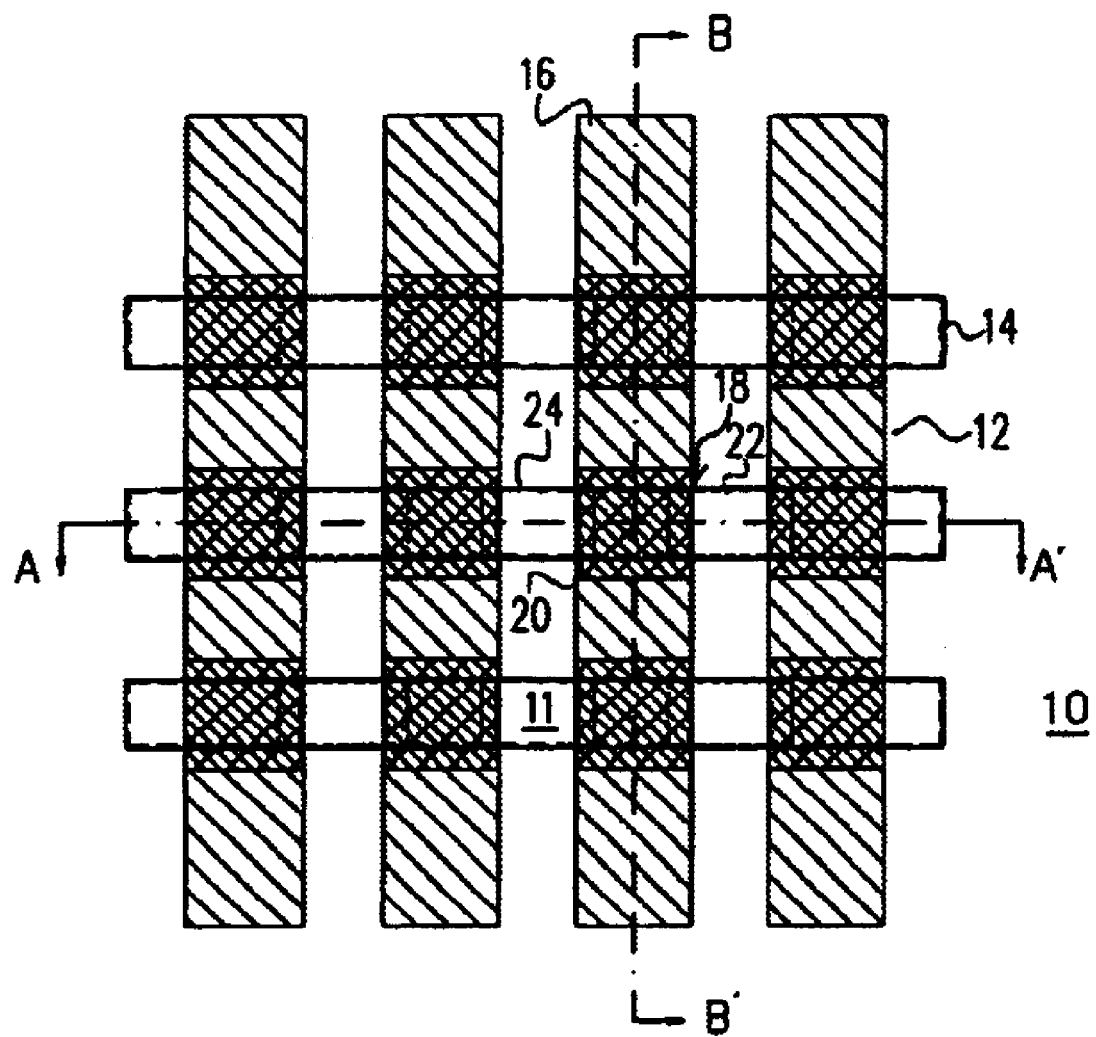
FIG. 1 shows a top view of a flash memory provided by the present invention.

FIG. 1 shows a top view of a flash memory provided by the present invention. The flash memory comprises a substrate 10, a device isolation structure 12, an active region 14, a control gate (word line) 16, a floating gate 18, an N-type source region 20, an N-type drain region 22, and a P-well 24. The substrate 10 has a deep P-well (not shown) therein, in which an N-well 11 is formed. The isolation structure 12 is formed in the substrate 10 to define the active region 14, such that the N-well 11 is located in the active region 14 only. The control gate 16 is formed on the substrate 10 perpendicular to the active region 14 and the floating gate 18 is formed under the control gate 16 in the active region 14 only. The P-well 24 is formed in the N-well 11 to encompass the source region 20 and extends underneath the floating gate 18 to reach the N-type drain region 22. Two neighboring memory cells formed in the same active region 14 share the same N-type drain region 12. The N-type drain region 12 is conducted via the N-well 11 in the substrate 10. That is, the N-type well 11 is used as the buried bit line. In addition, the source regions 20 of two neighboring memory cells formed in the same active region 14 share a common source line (not shown).

The fabrication method of the flash memory is as follows. FIGS. 2A to 2H show the cross sectional views along the cutting line A–A", and FIGS. 3A to 3D show the cross sectional views along the cutting line B–B".

Figure 2A:
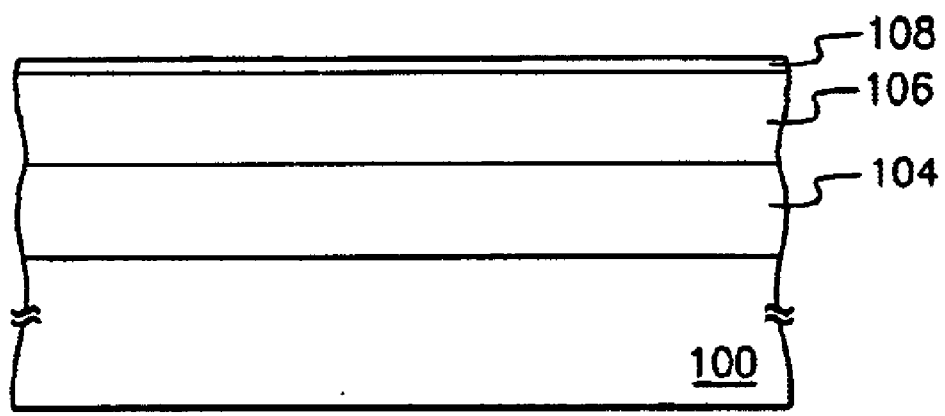
FIGS. 2A to 2H are cross-sectional views along the cutting line A–A" as shown in FIG. 1.
Figure 3A:
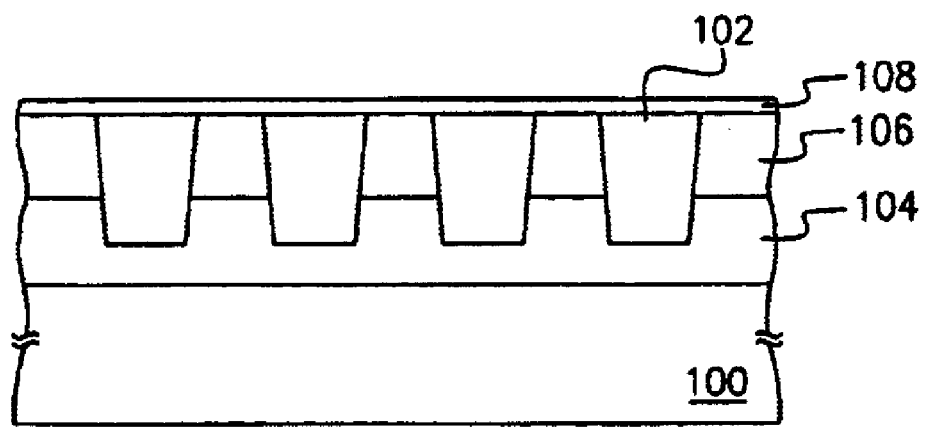
FIGS. 3A to 3C are cross-sectional views along the cutting line B–B" as shown in FIG. 1.

Referring to FIGS. 2A and 3A, an N-type substrate 100 is provided. In the N-type substrate 100, a device isolation structure 102 has been formed with a strip-like layout to define the active regions. The method for forming the device isolation structure 102 includes local oxidation (LOCOS) or shallow trench isolation (STI). The device isolation structure 102 has to be deep enough to isolate the N-well 106 formed subsequently. The depth of the device isolation structure 102 is about 4500 angstroms, for example. A deep P-well 104 is formed in the N-type substrate 100, and an N-well 106 is formed in the P-well 104. The N-well 106 has a depth no deeper than that of the isolation structure 102, for example, about 1000 to 1500 angstroms. An oxide layer 108 is formed on the N-type substrate 100 as the tunneling oxide layer. The method for forming the oxide layer 108 includes thermal oxidation, for example, and the thickness of the oxide layer 108 is about 90 angstroms to about 100 angstroms.

Figure 2B:
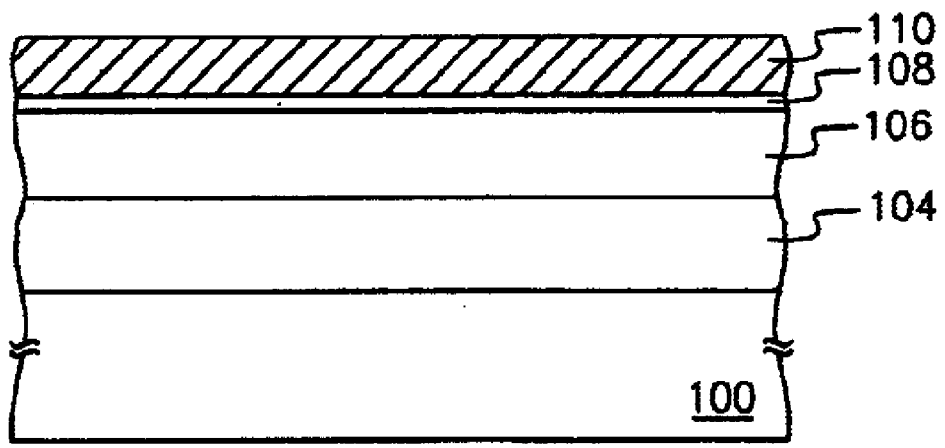
Figure 3B:
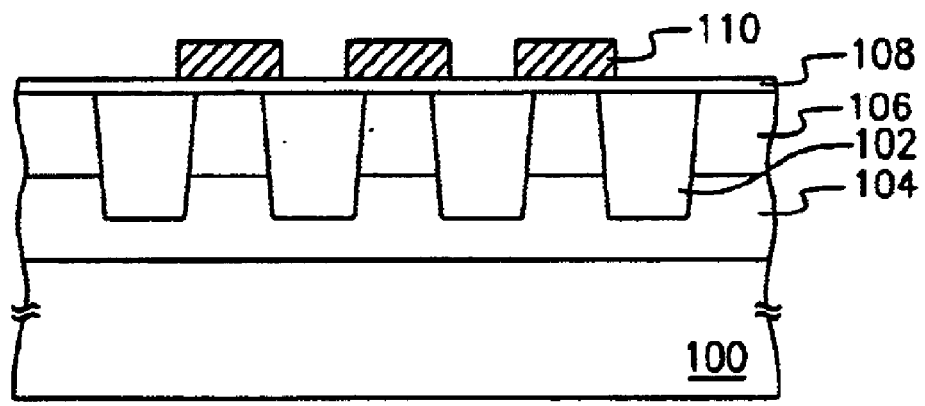

Referring to FIGS. 2B and 3B, a conductive layer (not shown) is formed on the oxide layer 108. The material of the conductive layer includes polysilicon, for example. The method for forming the conductive layer includes forming an undoped polysilicon layer using chemical vapor deposition, followed by an ion implantation step, for example. The thickness of the conductive layer is about 800 angstroms. The conductive layer is then patterned to expose a part of the surface of the device isolation structure 102. The patterned conductive layer is denoted by the numeral reference 110 in FIGS. 2B and 3B.

Figure 2C:
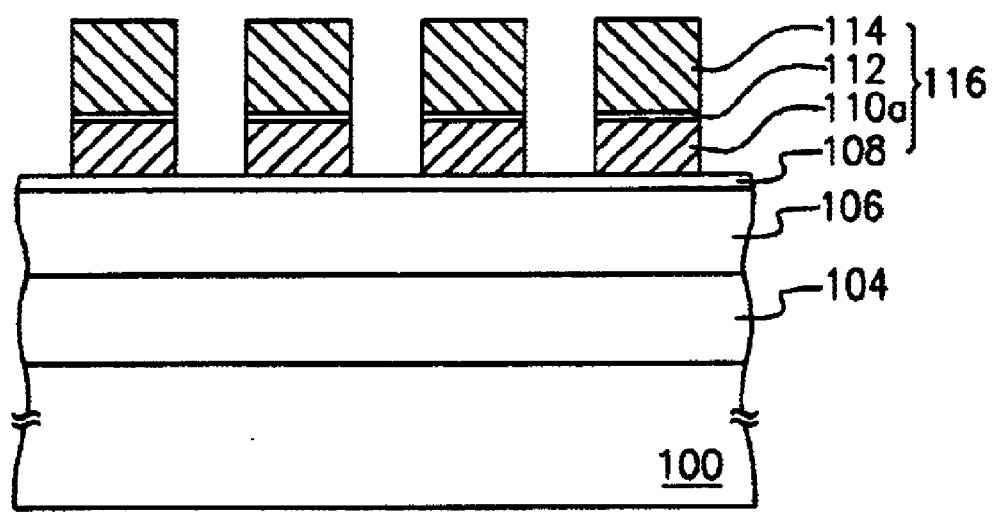
Figure 3C:
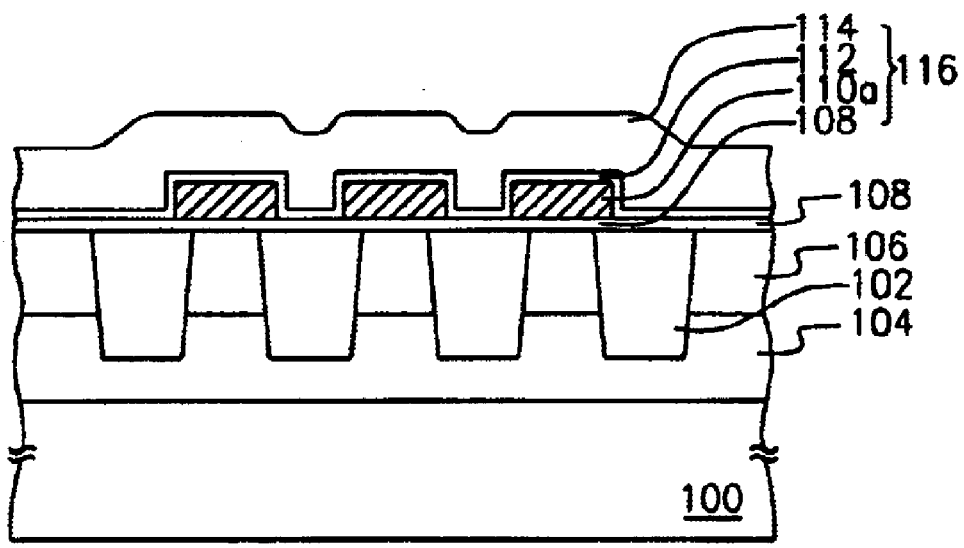

Referring to FIGS. 2C and 3C, a dielectric layer (not shown) and a conductive layer (not shown) are formed on the N-type substrate 100. A mask layer is used for patterning the conductive layer as the conductive layer 114 of the control gate 114. While patterning the conductive layer 114, the same mask is used to define the dielectric layer and the conductive layer 110 for forming the dielectric layer 112 and the conductive layer 110a, which is used as the floating gate. That is, the stacked gate structure 116 of the flash memory is formed by the stack of the conductive layer (the control gate) 114, the dielectric layer 112, the conductive layer (the floating gate) 110a, and the oxide layer (the tunneling oxide layer) 108.

The material of the dielectric layer 112 includes oxide/nitride/oxide with the thickness of 60/70/60 angstroms, for example. The method for forming the dielectric layer 112 includes low-pressure chemical vapor deposition. The material of the dielectric layer 112 also includes silicon oxide or oxide/nitride.

The material of the conductive layer 114 includes doped polysilicon with a thickness of about 2000 angstroms. The method for forming the conductive layer 114 includes chemical vapor deposition with in-situ doping.

Figure 2D:
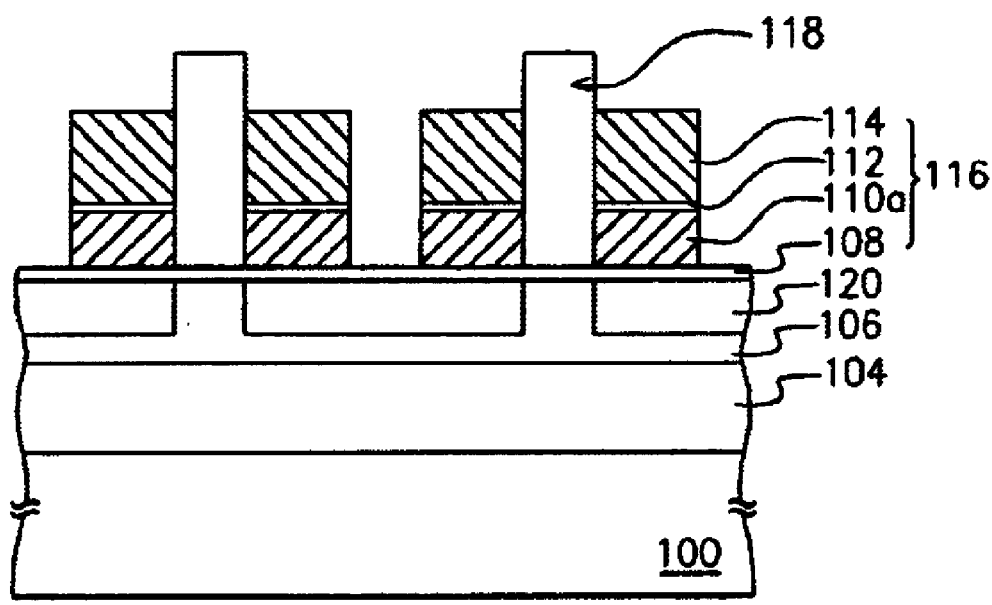

Referring to FIGS. 2D and 3D, a patterned photoresist layer 118 is formed to expose a predetermined source region. An ion implantation step is performed using the photoresist layer 118 as a mask, such that a doped region is formed in the N-well 106 of the substrate 100 near the predetermined source region. The photoresist layer 118 is removed. A thermal process is performed in a dry oxygen environment at a temperature of about 1000° C. The drive-in of the dopant under such conditions allows the doped region extending as a P-well 120 from the side of the predetermined source region under the stacked gate structure 116 to approach the area predetermined for forming the drain region. As the cross sectional structure along the cutting line B–B" remains the same in the subsequent processes, the following processes are described according to the cross sectional view along the cutting line A–A".

Figure 2E:
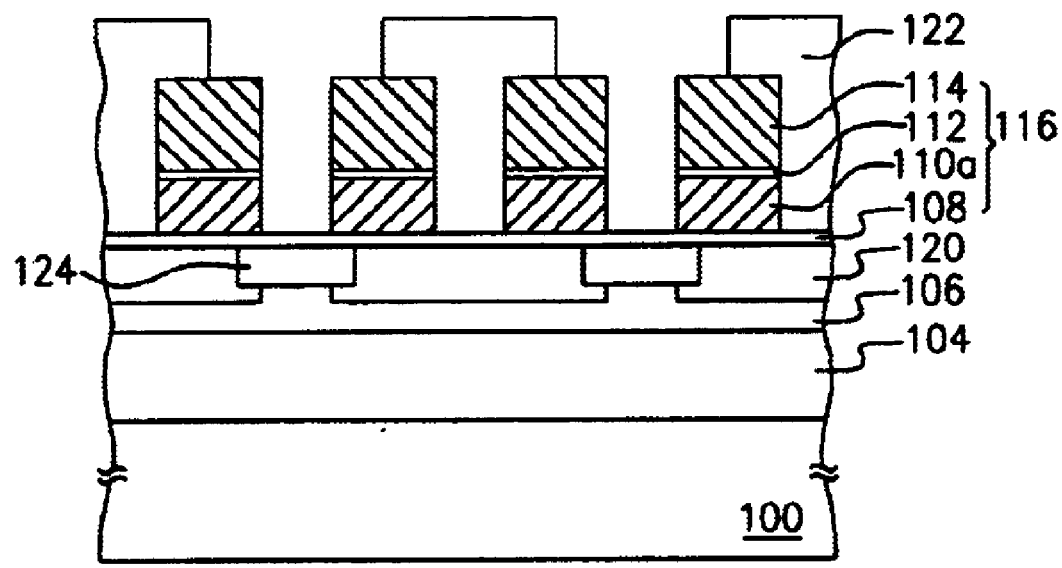

Referring to FIG. 2E, another patterned photoresist layer 122 is formed on the whole substrate 100 to expose the predetermined drain region. An ion implantation step is performed using the stacked gate structure 116 and the photoresist layer 122 as a mask. N-type dopant is then implanted into the predetermined drain region to form an N-type drain region 124. In the ion implantation step, arsenic ions with a dosage of about $1 \times 10^{15}$ atoms/cm2 and an implantation energy of about 50 KeV to about 60 KeV are implanted, followed by implanting phosphoric ions with a dosage of about $1 \times 10^{14}$ atoms/cm$^2$ and an implantation energy of about 30 KeV. The N-type drain region 124 and the N-well 106 are electrically connected. The patterned photoresist layer 122 is then removed.

Figure 2F:
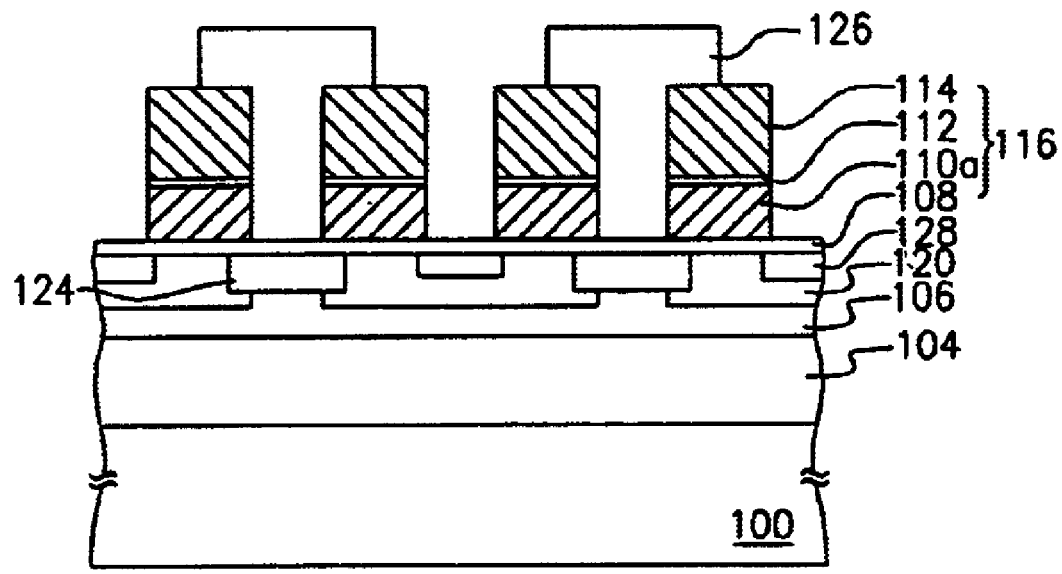

Referring to FIG. 2F, a patterned photoresist layer 126 is formed allover the substrate 100. The photoresist layer 126 exposes the predetermined source region. An ion implantation step is performed using the stacked gate structure 116 and the photoresist layer 126 as a mask. N-type dopant is then implanted into the predetermined source region to form an N-type source region 128 in the P-well 120. The N-type dopant includes arsenic ions with an implantation energy of about 50 KeV and a dosage of about $1 \times 10^{15}$ atoms/cm$^2$. The photoresist layer 126 is then removed.

Figure 2G:
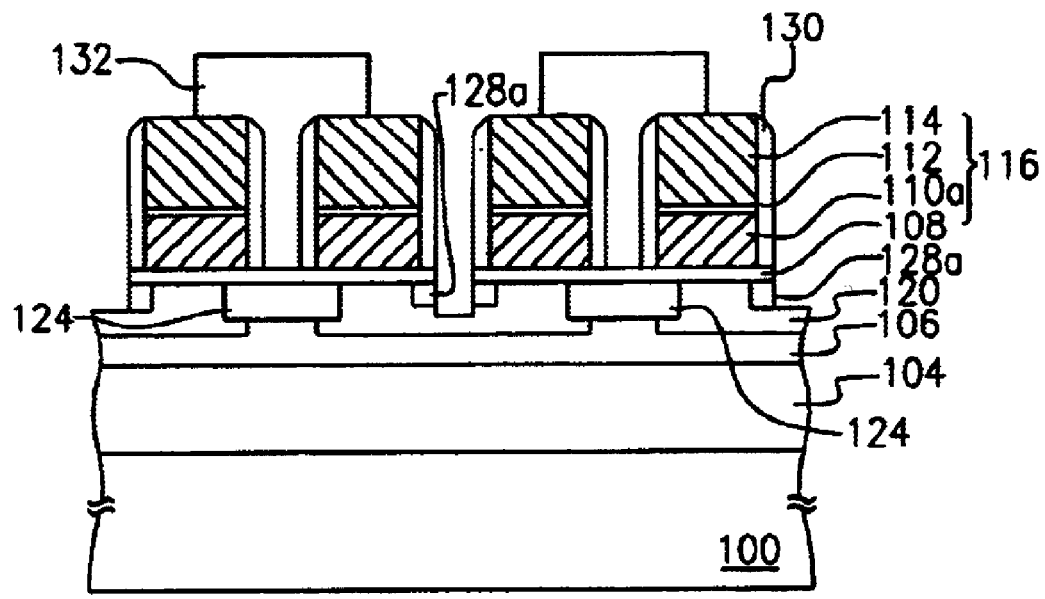

Referring to FIG. 2G, a spacer 130 is formed on a sidewall of the stacked gate structure 116. The steps for forming the spacer 130 include forming an insulation layer (not shown), followed by anisotropic etching step. The material of the insulation layer includes silicon nitride, for example. A patterned photoresist layer 132 is then formed all over the substrate 100 that leaves exposed the N-type source region 128. An etching step is performed using the patterned photoresist layer 132 and the stacked gate structure 116 with the spacer 130 as a mask. The substrate 100 is etched until a surface of the P-well 120 is exposed to form the N-type source region 128a. The N-type source region 128a is located under the spacer 130. Therefore, the contact window formed subsequently and the P-well 120 are electrically short circuited with each other.

Figure 2H:
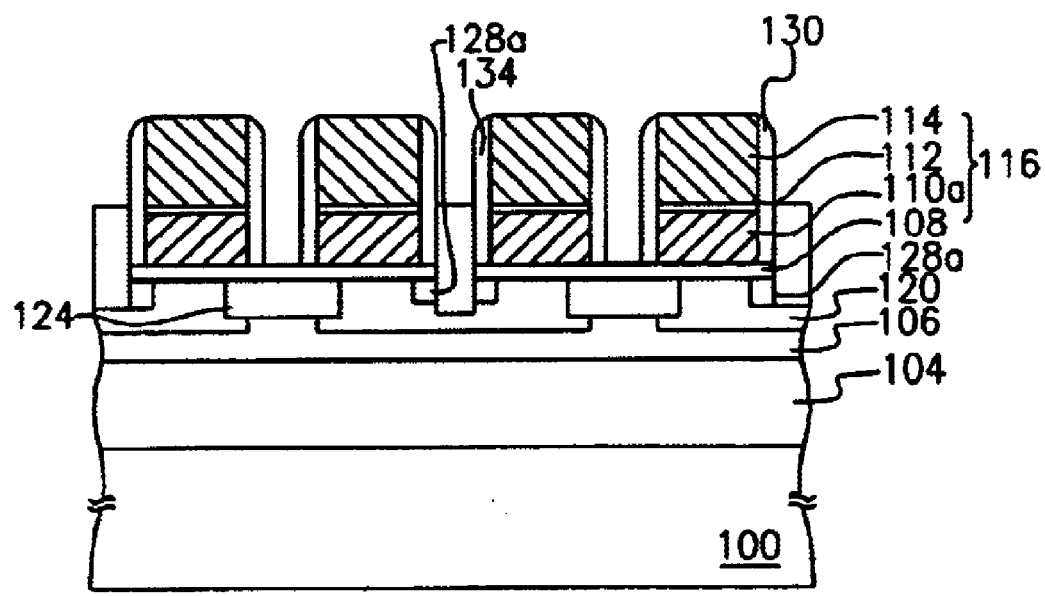

Referring to FIG. 2H, the photoresist layer 132 is removed, and the contact window 134 is formed on the P-well 120 between the gate structures 116. The material of the contact window includes tungsten. The method for forming the contact window 134 includes forming a patterned photoresist layer (not shown) on the substrate 100. The photoresist layer exposes the P-well 120 between the gate structure 116. A conductive layer (not shown) is then formed on the substrate 100 to fill the gap between the gate structure 116. An etch back step is performed until the surface of the conductive layer is lower than that of the stacked gate structure 116. The contact window 134 is thus formed on the source region 128a between the gate structure 116. The contact 134 is formed across the junction between the N-type source region 128a and the P-well 120, so that the N-type source region 128a and the P-well 120 are short circuited thereby. The process following for forming the flash memory that is not essential to the present invention is not further described.

The present invention uses the photoresist layer 118 to cover the predetermined drain region for performing P-type dopant implantation into the predetermined source region. A thermal process is performed to drive in the dopant in the substrate. The P-well 120 thus extends from the source region towards the drain region. Another photoresist layer is then formed to cover the predetermined source region. Arsenic ions and phosphoric ions are then implanted into the predetermined drain region for forming the N-type drain region 124. Another patterned photoresist layer is further formed to cover the predetermined drain region, allowing arsenic ions implanted into only the predetermined source region for forming the N-type source region 128. Being doped with arsenic ions and P ions, the N-type drain region 124 can withstand high voltage. Preferably, P ions can also be implanted to increase the overlapped area between the N-type drain region 124 and the floating gate. As the N-type drain region 124 is electrically connected to the N-well 106, the N-well 106 can be used as the burled bit line without forming an additional contact window to electrically connect the bit line and the N-type drain region 124.

Figure 4:
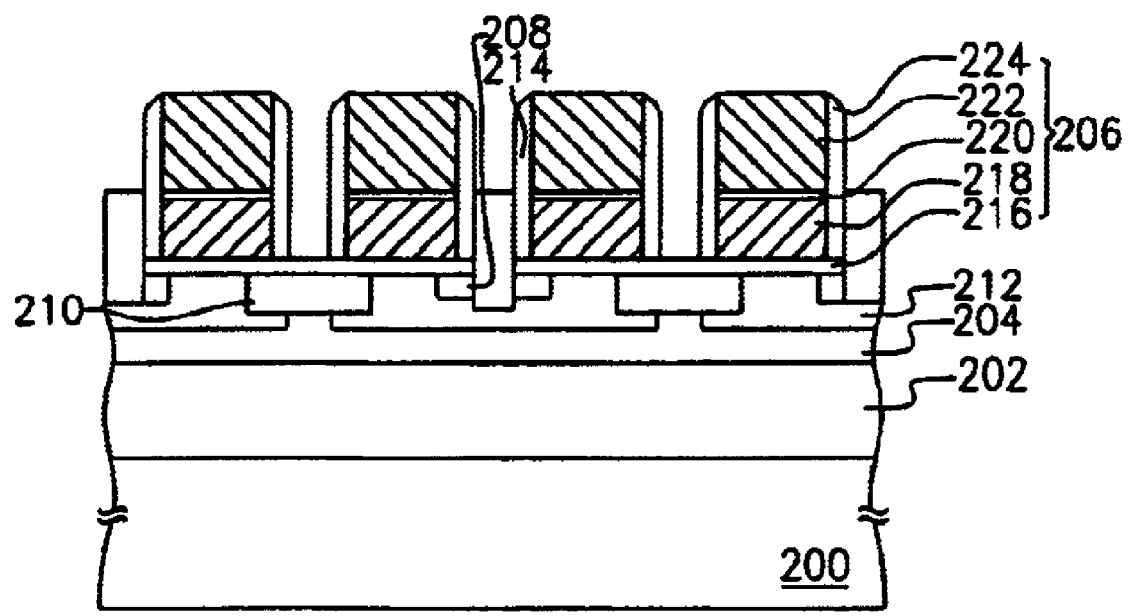
FIG. 4 shows the cross-sectional structure of a flash memory provided by the present invention.

FIG. 4 shows the cross sectional structure of the flash memory provided by the present invention.

Referring to FIG. 4, the flash memory includes an N-type substrate 200, a deep P-well 202, a N-well 204, a stacked gate structure 206, an N-type source region 208, an N-type drain region 210, a P-well 212 and a contact window 214. The stacked gate structure 206 is composed of a tunneling oxide layer 216, a floating gate 218, a gate dielectric layer 220, a control gate 222 and a spacer 224.

The deep P-well 202 is formed in the N-type substrate 200. The N-well 204 is formed in the deep P-well 202. The stacked gate structure 206 is formed on the N-type substrate 200. The N-type source region 208 is formed in the N-well 204 under the spacer 224 at one sidewall of the stacked gate structure 206. The N-type drain region 210 formed at the N-well 204 at the other side of the stacked gate structure 206 is electrically connected to the N-well 204. The P-well 212 is located in the N-well 204 to encompass the N-type source region 208 and extends underneath the stacked gate structure 206 to the N-type drain region 210. The contact window 214 across the junction between the N-type source region 208 and the P-well 202 short circuits the N-type source region 208 and the P-well 202.

In the present invention, the N-well 204 is formed in the deep P-well 202, and the N-well 204 electrically connected to the N-type drain region 210 can be used as the buried bit. Therefore, an additional contact window for connecting the bit line and the N-type drain region 210 is not required, so that the integration is increased.

Figure 5:
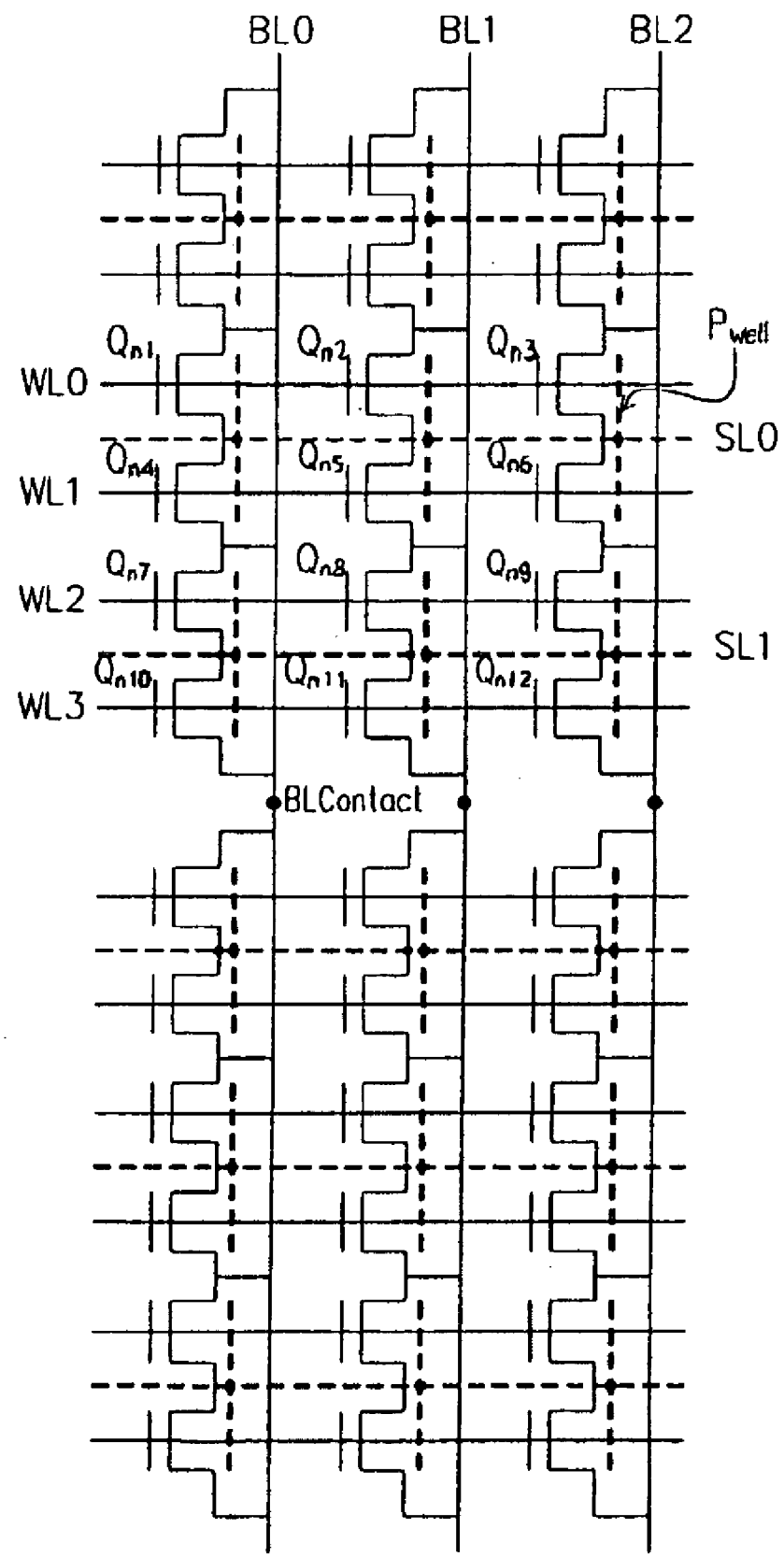
FIG. 5 shows the circuit diagram of the flash memory provided by the present invention.

FIG. 5 shows the circuit diagram of the flash memory. In FIG. 5, a flash memory includes a plurality of memory cells $Q_{n1}$ to $Q_{n12}$, bit line s BL0 to BL2, and word lines WL0 to WL3. Every two of the memory cells $Q_{n1}$ to $Q_{2n}$ are grouped as a set, and the memory cells $Q_{n1}$ to $Q_{n2}$ are arranged into a column/row array. The sources of the memory cells in each set share the same contact window, and two neighboring sets share a common drain region. The drain region of each memory cell of each set in each row is coupled to a corresponding buried bit line. The source region of each memory cell of each set in each column is coupled to a corresponding source line. The control gate of each memory cell in each column is coupled to a corresponding word line. For example, the drain region of each memory cell $Q_{n1}$, $Q_{n4}$, $Q_{n7}$, $Q_{n10}$ in the same row is coupled to the buried bit line BL0, the drain region of each memory cell $Q_{n2}$, $Q_{5n}$, $Q_{n8}$, $Q_{n11}$ in the same row is coupled to the buried bit line BL1, the drain region of each memory cell $Q_{n3}$, $Q_{n6}$, $Q_{n9}$, $Q_{n12}$ in the same row is coupled to the buried bit line BL2. The word line WL0 is coupled to the control gates of the memory cells $Q_{n1}$, $Q_{n2}$, $Q_{n3}$ the word line WL1 is coupled to the control gates of the memory cells $Q_{n4}$, $Q_{n5}$, $Q_{n6}$ the word line WL2 is coupled to the control gates of the memory cells $Q_{n7}$, $Q_{n8}$, $Q_{n9}$, and the word line WL3 is coupled to the control gates of the memory cells $Q_{n10}$, $Q_{n11}$, $Q_{n12}$. The memory cells $Q_{n1}$ and $Q_{n4}$, $Q_{n2}$ and $Q_{n5}$, $Q_{n3}$ and $Q_{n6}$ share a common source line SL0, and the memory cells $Q_{n7}$ and $Q_{n10}$, $Q_{n8}$ and $Q_{n11}$, $Q_{n9}$ and $Q_{n12}$ share a common source line SL1. Each of the memory cells $Q_{n1}$ to $Q_{n12}$ further includes the P-well $P_{well}$ that encompasses the source region and extends underneath the stacked gate structure towards the drain region. Each of the bit lines BL0 to BL2 can be connected to the metal line via the contact window.

The memory cell array uses the buried bit line to couple the drain region of each memory cell in each row. As the additional contact window for electrically connecting the bit line and the N-type drain region is not formed, the device integration is increased. Further, the buried bit line includes an N-well next to the source region, and the current is not affected by the resistance of the N-well (the burled bit line). Consequently, the device operation speed will not be affected. In addition, as the N-well has a lower resistance, the flash memory provided by the present invention can connect 32 to 64 memory cells in series, and use the contact window to connect the buried bit line and a metal line. Therefore, compared to the conventional NAND gate memory array, the integration is relatively increased.

Figure 6A:
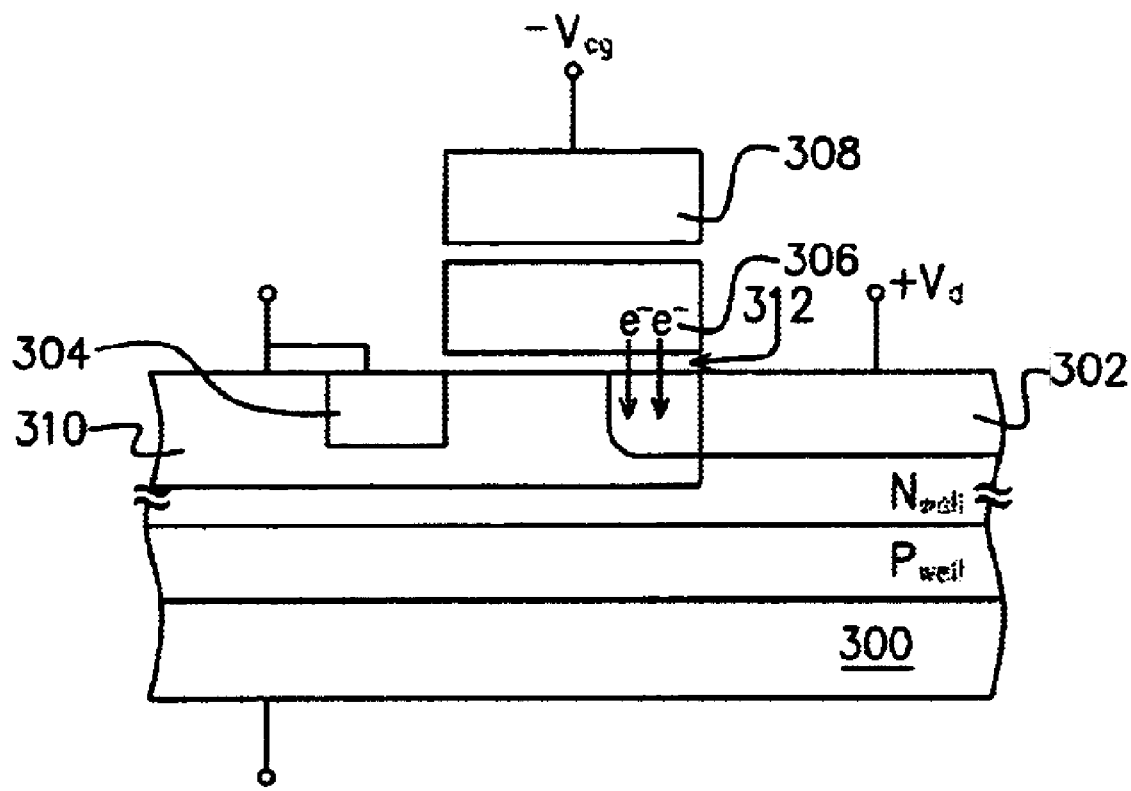
FIG. 6A shows the program operation of the flash memory provided by the present invention.
Figure 6B:
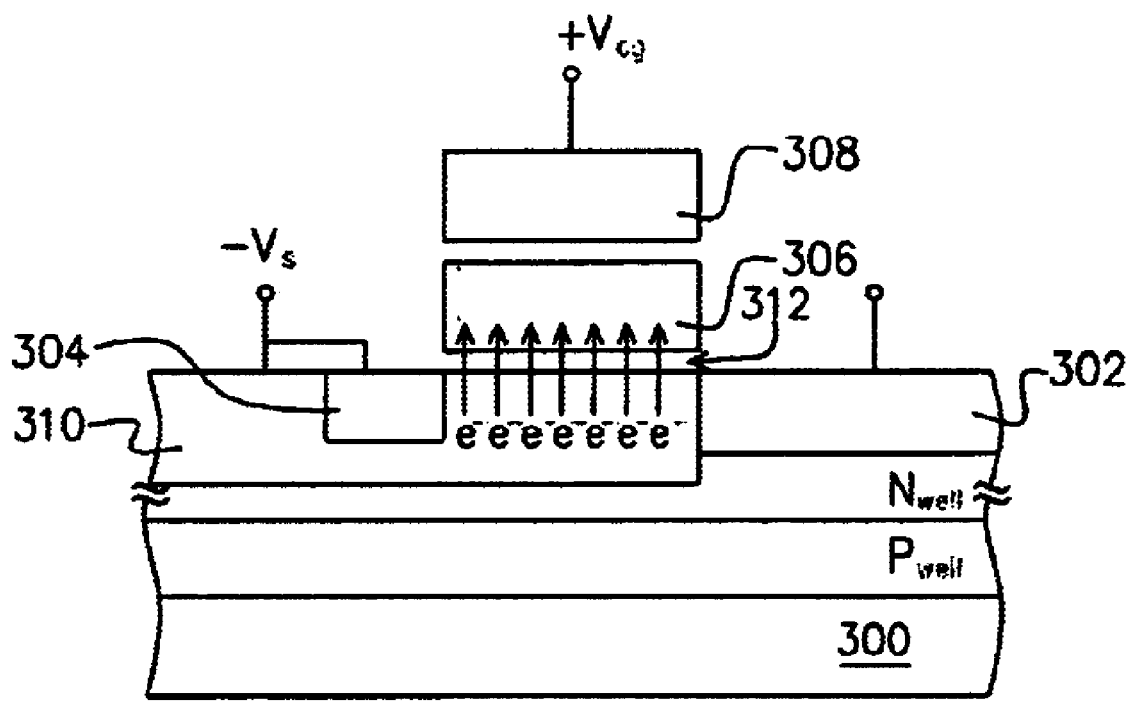
FIG. 6B shows the erase operation of the flash memory provided by the present invention.

Referring to Table 1, FIGS. 6A and 6B, the operation mode of the flash memory provided in one embodiment of the present invention is shown. The operation modes include the program mode as shown in FIG. 6A, the reading mode, and the erase mode as shown in FIG. 6B. The memory cell $Q_{n5}$ as shown in FIG. 3 is used as an example.

For programming the memory cell $Q_{n5}$, a negative bias $V_{cg}$ such as 10V to 12V is applied to the control gate 308 (EL1) thereof, a positive voltage+$V_d$ such as 3V to 6V is applied to the drain region 302 (SL0). The source region 304 (BL1) is floating, and the deep P-well (substrate 300) is grounded. For programming, a large electric field between the floating gate 308 and the substrate 300 is established to use F-N tunneling effect to pull electrons from the floating gate 306 via the channel as shown in FIG. 6A.

TABLE 1

|  | Program | Read | Erase |
| --- | --- | --- | --- |
| Selected Bit Line BL1 | +$V_D$ | +1.5 | Floating |
| Non-Selected Bit lines BL0, BL2 | 0V | 0V | 0V |
| Selected Word Line WL | −$V_{op}$ | $V_{or}$ | +$V_{ag}$ |
| Non-Selected Word Lines WL0 WL1, WL3 | 0V | 0V | 0V |
| Selected Source Line | Floating | 0V | −$V_s$ |
| Non-Selected Source Line | Floating | Floating | Floating |
| Deep P-well | 0V | 0V | 0V |

In the above program operation, the memory cells $Q_{n4}$ and $Q_{n6}$ will not be programmed. This is because the bit lines BL0 and BL2 are grounded (0V), so the tunneling effect will not occur to the memory cells $Q_{n4}$ and $Q_{n6}$.

In addition, voltage of the word line WL0 connected to the memory cells $Q_{n1}$, $Q_{n2}$, $Q_{n3}$, the word line WL2 connected to the memory cells $Q_{n7}$, $Q_{n8}$, $Q_{n9}$, and the word line WL3 connected to the memory cells $Q_{n10}$, $Q_{n11}$, $Q_{n12}$ is 0V, such that FN-tunneling effect will not be generated for the memory cells $Q_{n1}$ to $Q_{n3}$ and $Q_{n7}$ to $Q_{n12}$.

While performing reading operation on the memory cell $Q_{n5}$, the bias of the bit line BL1 (drain region 302) is $V_d$, for example, 1V to 1.5V, the word line WL1 (control gate 308) and the source line SL0 (source region 304) are at 0V, and the other word lines WL0, WL2 and WL3 are grounded (0V). As the off channel of the memory cell of which the floating gate 306 retains electrons is relative small, and the on channel of the memory cell of which the floating gate 306 does not retain any electron is relatively large, the magnitude of current can be determined according to the digital information "1" or "0" of the memory cell.

While performing an erase operation for the memory cell $Q_{n5}$, a positive bias+$V_{cg}$ such as 10V to 12V is applied to the word line WL0 (control gate 308). A negative bias $V_s$ such as 3V to 6V is applied to the source line SL0 (source region 304). The drain region 302 and the deep P-well (the substrate 300) are thus grounded (0V). Consequently, a large electric field is established, and the FN-tunneling effect can be applied to inject electrons to the floating gate via the channel as shown in FIG. 4B.

During the erase operation, the memory cells $Q_{n4}$ and $Q_{n6}$ will be programmed. This is because the memory cells $Q_{n4}$, $Q_{n5}$ and $Q_{n6}$ share a common word line WL1 and the source line SL0. Therefore, the erase operation is performed segment by segment in the flash memory provided by the present invention.

In addition, the word line WL0 connected to the memory cells $Q_{n1}$, $Q_{n2}$, $Q_{n3}$, the word line WL2 connected the memory cells $Q_{n7}$, $Q_{n8}$, $Q_{n9}$, and the word line WL3 connected to the memory cells $Q_{n10}$, $Q_{n11}$, $Q_{n12}$ are connected to 0V, so that the F-N tunneling will not be generated to erase the data saved therein.

In the flash memory provided by the present invention, an N-well is formed in the deep P-well as the buried bit line without forming an additional contact window to connect the bit line and the drain region, so that the device integration is enhanced. Further, as the relative high resistance of the N-well next to the drain region does not affect the operation current, the device operation speed using the N-well as the buried bit line will not be seriously affected.

Further, the program operation of the flash memory provided by the present invention uses the FN-tunneling effect to result in high electron injection efficiency, so that the current for programming memory cell is reduced. As both the program and erase operations use the FN tunneling effect, the lower current efficiency reduces the power consumption of the whole memory device. In the mean time, parallel program and erase for a large-scale page can also be performed. In addition, because there is no need to form the additional contact window for connecting the bit line and the drain region, the device integration is increased.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A structure of a flash memory, comprising:

a first conductive type substrate;

a deep well of second conductive type which is formed in the substrate;

a first well of first conductive type which is formed in the substrate but not deeper than the deep well;

two stacked gate structures formed on the substrate, wherein the two stacked gate structures are separated with each other with a distance;

a second well of second conductive type which is formed in the substrate but not deeper than the first well, wherein the two stacked gate structures are disposed on the surface of the second well;

a source region of first conductive type which is formed in and surrounded by the second well, wherein the edge of the source region is connected with the two stacked structures;

two drain regions of first conductive type which is formed at the two sides of the source region in the substrate, wherein the edges of the two drain regions are connected with the two stacked gate structures and the second well; and a contact formed across the junction of the source region and the second well to make the source region and the second well short circuit.

2. The structure according to claim 1, wherein each of the stacked gate structures includes a control gate, a dielectric layer, a floating gate, and a tunneling oxide layer.

3. The structure according to claim 1, wherein the first conductive type is N-type.

4. The structure according to claim 1, wherein the second conductive type is P-type.

5. The structure according to claim 1, wherein the source region and the drain region are doped with N-type ions.

6. An operation method of the flash memory as recited in claim 1, comprising the steps of:

programming the flash memory by applying a first negative voltage to a control gate of one of the plural stacked gate structures, applying a first positive voltage to the drain region corresponding to the stacked gate structure, and setting the source region thereof as floating; and erasing the flash memory by applying a second positive voltage to the control gate, applying a second negative voltage to the source region, and setting the drain region as floating.

7. The operation method according to claim 6, wherein the first negative voltage is about −10 V to −12 V.

8. The operation method according to claim 6, wherein the first positive voltage is about 3 V to 6V.

9. The operation method according to claim 6, wherein the second positive voltage is about 10 V to 12 V.

10. The operation method according to claim 6, wherein the second negative voltage is about −3 V to −6 V.

11. A method of fabricating a flash memory, comprising:

providing a first conductive type substrate;

forming a deep well of second conductive type in the substrate;

forming a first well of first conductive type in the substrate, wherein the first well is not deeper than the deep well;

forming two stacked gate structures on the substrate, wherein the two stacked gate structures are separated with each other with a distance;

forming a second well of second conductive type in the substrate, wherein the second well is not deeper than the first well and the two stacked gate structures are disposed on the surface of the second well;

forming a source region of first conductive type in the second well, wherein the source region is surrounded by the second well, and the edge of the source region is connected with the two stacked structures;

forming two drain regions of first conductive type at the two sides of the source region in the substrate, wherein the edges of the two drain regions are connected with the two stacked gate structures and the second well; and forming a contact formed across the junction of the source region and the second well to make the source region and the third well short circuit.

12. The method according to claim 11, wherein the step of forming the two stacked gate structures includes:

forming a tunneling oxide layer;

forming a floating gate on the tunneling oxide layer;

forming a dielectric layer on the floating gate; and forming a control gate on the dielectric layer.

13. The method according to claim 11, wherein the step of forming the second well further includes a drive-in step.

14. The method according to claim 13, wherein the drive-in step is performed at a temperature of about 1000° C.

15. The method according to claim 11, wherein the first conductive type is N-type.

16. The method according to claim 11, wherein the second conductive type is P-type.

17. The method according to claim 11, wherein the step of forming the drain region includes:

implanting the substrate with arsenic ions, wherein the implantation energy is about 50 keV to 60 keV, and the dosage is about $3\times10^{15}$ atoms/cm$^2$; and implanting the substrate with phosphoric leas, wherein the implantation energy is about 30 keV, and the dosage is about $1\times10^{14}$ atoms/cm$^2$.

* * * * *